United States Patent
McKenzie et al.

(10) Patent No.: US 10,153,204 B2
(45) Date of Patent: Dec. 11, 2018

(54) WAFER LEVEL PACKAGING OF REDUCED-HEIGHT INFRARED DETECTORS

(71) Applicant: FLIR Systems, Inc., Wilsonville, OR (US)

(72) Inventors: Tiahaar Kurtheru Clayton McKenzie, Santa Barbara, CA (US); Richard E. Bornfreund, Santa Barbara, CA (US); Devin Leonard, Santa Barbara, CA (US); Gregory A. Carlson, Ventura, CA (US)

(73) Assignee: FLIR Systems, Inc., Wilsonville, OR (US)

(*) Notice: Subject to any disclaimer, the term of this patent is extended or adjusted under 35 U.S.C. 154(b) by 0 days.

(21) Appl. No.: 14/728,967

(22) Filed: Jun. 2, 2015

(65) Prior Publication Data

US 2015/0358558 A1 Dec. 10, 2015

Related U.S. Application Data

(60) Provisional application No. 62/007,788, filed on Jun. 4, 2014.

(51) Int. Cl.
*H01L 21/78* (2006.01)
*H01L 27/146* (2006.01)
(Continued)

(52) U.S. Cl.
CPC ............ *H01L 21/78* (2013.01); *H01L 21/681* (2013.01); *H01L 27/14618* (2013.01);
(Continued)

(58) Field of Classification Search
CPC ............ H01L 21/681; H01L 27/14687; H01L 27/14649; H01L 2223/54426; H01L 2223/5446; H01L 2223/5448
See application file for complete search history.

(56) References Cited

U.S. PATENT DOCUMENTS 6,086,453 A * 7/2000 Fukuoka ............ G01N 21/9501
451/5
6,347,005 B1 * 2/2002 Toriyama ............... G01R 1/071
324/754.06

(Continued)

*Primary Examiner* — Jay C Chang
*Assistant Examiner* — Mikka Liu
(74) *Attorney, Agent, or Firm* — Haynes and Boone, LLP (57) ABSTRACT

Systems and methods may be provided for generating reduced-height circuit packages such as infrared detector packages. An alignment and dicing system may include an infrared camera that captures images of alignment marks of a wafer assembly through a lid wafer of the wafer assembly, a light source that illuminates the alignment marks through the lid wafer, and dicing equipment that dices the wafer assembly based on infrared images captured using the infrared camera. The light source may illuminate the alignment marks through the lid wafer by providing light such as infrared light to the wafer assembly through optics of the infrared camera. The infrared camera may capture images of alignment marks formed on a detector wafer of the wafer assembly or on an interior or lower surface of the lid wafer through the lid wafer. The dicing equipment may be aligned with the wafer assembly based on the captured images.

18 Claims, 8 Drawing Sheets

(51) Int. Cl.
*H01L 21/68* (2006.01)
*H01L 21/67* (2006.01)

(52) U.S. Cl.
CPC .. *H01L 27/14649* (2013.01); *H01L 27/14687* (2013.01); *H01L 21/67092* (2013.01); *Y10T 83/533* (2015.04)

(56) References Cited

U.S. PATENT DOCUMENTS

| | | | |
|---|---|---|---|
| 8,179,529 B1 | 5/2012 | Berry et al. | |
| 2002/0000646 A1* | 1/2002 | Gooch | B81B 7/0077 257/666 |
| 2003/0113444 A1* | 6/2003 | Flosbach | B05D 1/286 427/140 |
| 2006/0024920 A1* | 2/2006 | Goto | B81C 1/00888 438/460 |
| 2006/0263931 A1* | 11/2006 | McClure | H03H 9/059 438/106 |
| 2012/0292494 A1* | 11/2012 | Silny | G01J 1/0414 250/252.1 |
| 2013/0088567 A1* | 4/2013 | Fitzpatrick | G03B 15/006 348/37 |
| 2014/0301631 A1* | 10/2014 | Maeda | G06T 3/0068 382/151 |
| 2015/0253133 A1* | 9/2015 | Sisney | G02B 13/146 356/4.01 |
| 2016/0178898 A1* | 6/2016 | Eineren | G03B 17/02 348/375 |

\* cited by examiner

WAFER LEVEL PACKAGING OF REDUCED-HEIGHT INFRARED DETECTORS

CROSS-REFERENCE TO RELATED APPLICATIONS

This application claims the benefit of and priority to U.S. Provisional Patent Application No. 62/007,788 filed Jun. 4, 2014 and entitled "WAFER LEVEL PACKAGING OF REDUCED-HEIGHT INFRARED DETECTORS" which is hereby incorporated by reference in its entirety.

TECHNICAL FIELD

One or more embodiments of the invention relate generally to infrared cameras and, more particularly, to infrared detectors and infrared camera architectures and systems and methods for manufacturing infrared detectors and infrared camera architectures.

BACKGROUND

Thermal infrared cameras are well known and used in a wide variety of applications. A typical thermal infrared camera, often referred to simply as an infrared camera or IR camera, uses an infrared detector to detect infrared energy that is provided to the infrared detector through an infrared camera lens—a lens capable of transmitting infrared energy. The infrared camera may also include a display for a user to view images generated by the infrared camera based on the infrared energy, or the images may be stored by the infrared camera or transmitted (e.g., via a wireless or wired network) for remote viewing and/or storage.

Infrared detectors for such infrared cameras can be formed using wafer level packaging (WLP) techniques to form microbolometer vacuum package assemblies (VPAs). During WLP operations, a wafer assembly having multiple semiconductor wafer layers is diced to form multiple circuit packages such as infrared detectors. Dicing equipment is commonly aligned with the wafer assembly using alignment marks formed on an outer surface of the wafer assembly.

As electronic devices such as mobile phones and cameras become smaller and thinner in response to consumer demand for compact devices, it is sometimes desirable to reduce the thickness of a circuit package for such devices by thinning one or more of the wafer layers prior to singulation of the individual circuit packages from the wafer. However, it can be challenging, particularly in the case of semiconductor wafers for infrared detectors due to the optical properties of the wafer materials, to align dicing equipment or other processing equipment with a wafer assembly that has been thinned because the thinning can remove the surface on which the alignment marks are typically formed.

Accordingly, a need exists in the art for reduced thickness infrared detectors and WLP methods, systems, and apparatuses that accommodate that enable volume production of such detectors.

SUMMARY

In accordance with one or more embodiments of the invention, reduced height circuit packages such as reduced height infrared detectors are provided, together with methods for producing them reliably and efficiently in volume quantities using wafer level packaging (WLP) techniques.

In accordance with an embodiment, a first wafer and a second wafer may be provided. The first wafer may be attached to the second wafer. One or more alignment marks may be formed on and/or within the first wafer and/or the second wafer. The first wafer and/or the second wafer may be thinned. The alignment marks may be formed on and/or within the first wafer and/or the second wafer such that, following the thinning, the alignment marks remain on and/or within the first wafer and/or the second wafer to be used in later wafer level processing operations. The first wafer may be substantially transparent in some or all of the infrared (IR) portion of the electromagnetic spectrum. For example, the first wafer may be substantially transparent to short wave infrared (SWIR) light. The first wafer and/or the second wafer may be provided with an array of circuits separated by dicing lanes. A system such as a dicing system may be provided with a camera capable of viewing the alignment marks through at least a portion of the first wafer. The system may align wafer level processing equipment such as a dicing saw with the first and second wafers using the alignment marks as viewed through at least a portion of the first wafer and may perform wafer level processing operations such as slicing through the first wafer and/or the second wafer along the dicing lanes based on the aligning. The first wafer may, for example, represent a lid or cap wafer. The second wafer may, for example, represent an infrared detector wafer having an array of infrared detector arrays that are covered by the lid or cap wafer.

In accordance with an embodiment, a lid wafer and a detector wafer may be provided. The lid wafer may, for example, represent a window wafer. The lid wafer may be formed from a substrate that is substantially opaque in the visible portion of the electromagnetic spectrum and substantially transparent in the infrared (IR) portion of the electromagnetic spectrum. The lid wafer may, for example, be formed from silicon. The detector wafer may include a substrate having a complementary metal oxide semiconductor (CMOS) readout integrated circuit (ROIC) and bolometer structures electrically connected to the CMOS ROIC. The detector wafer and/or lid wafer may be thinned (e.g., by thinning either only the lid wafer or both wafers simultaneously). An IR camera in a dicing system may be provided which is capable of seeing through the lid wafer to alignment targets (e.g., alignment marks formed on the backside of the lid wafer, within the lid wafer, and/or on and/or within the CMOS ROIC) which allow for dicing of one or both of the wafers to be performed by the dicing system. Dicing operations using the alignment targets may be performed that expose electrical bond pads on the detector substrate for electrical testing of infrared detectors and/or other circuitry on the detector wafer.

In accordance with one embodiment, an infrared detector formed using, for example, the thinning and dicing processes described above, includes a detector substrate having an array of infrared detector elements (e.g., microbolometers) and a readout integrated circuit interconnected with the array disposed on an upper surface thereof. The detector substrate may, in some embodiments, be a thinned substrate. A generally planar lid may be disposed above the array, the lid being formed from a material that is substantially transparent to infrared light. One or more alignment marks may be formed on the upper surface of the substrate, embedded completely or partially within the substrate, and/or formed on and/or within the lid. The lid may be attached to the substrate and may include a recess that defines a closed cavity between a portion of the lid and the substrate that encloses the array and/or a mesa may be bonded to the lid (window) and, in combination with the lid, define a closed cavity between the lid and the substrate that encloses the array. The lid may be a relatively thin lid in comparison with conventional infrared detector packages and may be formed from a thinned lid wafer during wafer level packaging operations.

In accordance with another embodiment, a method for making an infrared detector may be provided in which a detector wafer may be attached to a lid wafer having a plurality of cavities that are aligned with corresponding detector arrays on the detector wafer to form a wafer assembly. Dicing equipment may be aligned with the wafer assembly by capturing infrared images through the lid wafer of one or more alignment marks on and/or within the detector wafer and/or on an interior surface of and/or within the lid wafer. If desired, the lid wafer and/or the detector wafer can be thinned before or after attaching the lid wafer to the detector wafer. By providing the alignment marks on the detector wafer or on an interior surface of the lid wafer in a location that is visible to an infrared camera through the lid wafer, the wafer assembly can be thinned, or not, as desired without affecting the later alignment of processing equipment such as dicing equipment with the wafer assembly.

In accordance with another embodiment, a system for making an infrared detector may be provided in which an infrared camera capable of viewing alignment marks through a lid wafer that is formed from a material that passes infrared light is provided. The system may include an infrared camera, a light source that illuminates the alignment marks through the lid wafer, and dicing equipment that dices the wafer assembly based on infrared images captured using the infrared camera and, if desired, the light source.

The scope of the invention is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the figures of the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

In accordance with various embodiments, a circuit package may be provided having a first substrate coupled to a second substrate. The circuit package may be formed in a process in which a first wafer is attached to a second wafer and alignment marks on and/or within the first wafer and/or the second wafer are viewed through at least a portion of the first wafer and used for additional wafer level processing operations. In some embodiments, the first wafer and/or the second wafer may be thinned prior to viewing the alignment marks through the at least the portion of the first wafer. The circuit package may be formed by dicing the first and second wafers using the alignment marks.

In one embodiment, the circuit package may be included in an infrared (IR) camera. For example, an IR camera may include an infrared detector or infrared detector package (e.g., a focal plane array (FPA) or vacuum package assembly (VPA), such as a wafer level package (WLP) VPA). An infrared detector package such as an infrared VPA may include a substrate, a readout integrated circuit (ROIC) on a surface of the substrate, an array of detector elements coupled to the ROIC, and a cap or lid that seals the array of detector elements in an evacuated chamber.

The substrate and/or the cap may be thinned in order to reduce the height of the IR camera architecture for inclusion in, for example, mobile or portable computing devices or other compact electronic devices. Systems and methods may be provided for mass production of thinned circuit packages such as infrared camera vacuum package assemblies with thinned caps and/or detector substrates using, for example, wafer level processing techniques and infrared imaging processes.

Figure 1:
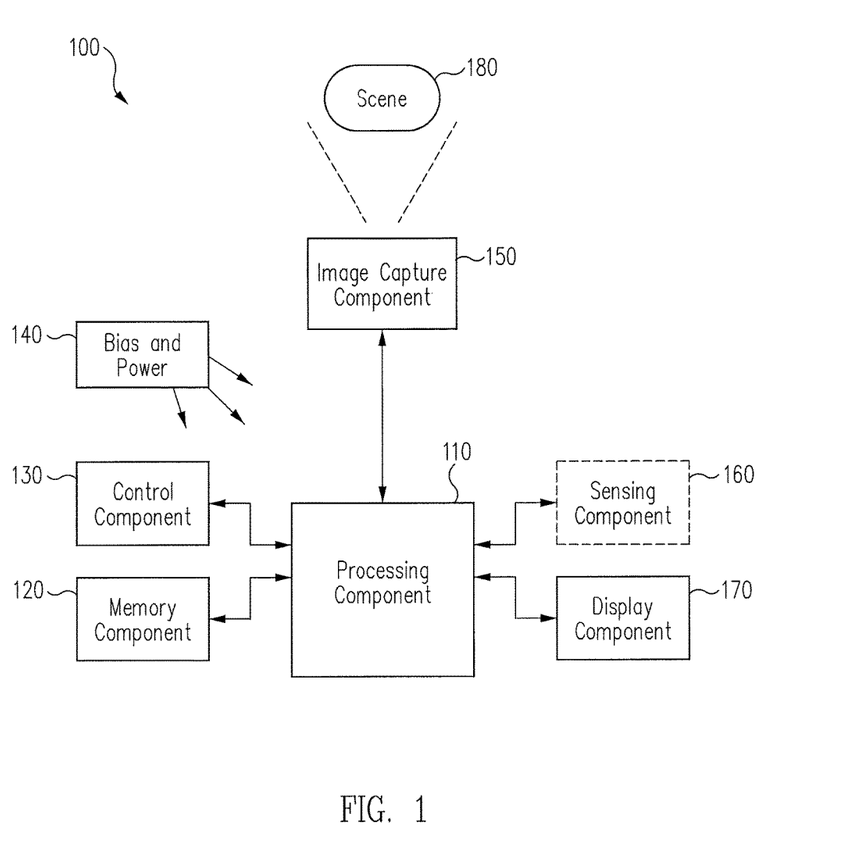
FIG. 1 shows a block diagram illustrating an infrared camera system in accordance with one or more embodiments.

FIG. 1 provides a block diagram illustrating a system 100 (e.g., an IR camera or IR camera system or other electronic device), which is configured to capture and process IR images, in accordance with one or more embodiments of the invention. System 100 may represent an IR camera system, which includes one of the IR camera architectures having a thinned cap and/or a thinned detector substrate as disclosed herein.

System 100 comprises, in one implementation, a processing component 110, a memory component 120, a control component 130, a power component 140, an image capture component 150, and a display component 170. Optionally, system 100 may include a sensing component 160.

System 100 may represent, for example, an infrared imaging device, such as an infrared camera (e.g., an infrared camera system), to capture and process images, such as still or video IR images of a scene 180. Image capture component 150 may include at least one of the IR camera architectures disclosed herein (e.g., an infrared camera vacuum package assembly having a thinned cap and/or detector substrate).

System 100 may represent a distributed network system with one or more IR camera architectures that are networked to a computer (e.g., a server), a portable electronic device (e.g., a mobile phone, a laptop computer, a tablet computer, a wearable imaging device, etc.), a desktop computer, a vehicle (e.g., an automobile or other type of land-based vehicle, an aircraft, a marine craft, or a spacecraft) or a non-mobile installation requiring infrared images (e.g., IR image data) or other system or device for infrared imaging.

In accordance with one or more embodiments, processing component 110 may comprise any type of a processor or a logic device (e.g., a programmable logic device (PLD) or ASIC configured to perform processing functions). Processing component 110 may be adapted to interface and communicate with components 120, 130, 140, 150, and 170 to perform method and processing steps and/or operations, as would be understood by one skilled in the art.

Memory component 120 comprises, in accordance with an embodiment, one or more memory devices adapted to store data and information, including for example infrared data and information. Memory device 120 may comprise one or more various types of memory devices, including volatile and non-volatile memory devices. Processing component 110 may be adapted to execute software or be configured by a bit stream stored in memory component 120 so as to perform method and process steps and/or operations described herein.

Image capture component 150 comprises, in accordance with an embodiment, any type of infrared image sensor, such as for example one or more infrared sensors (e.g., any type of multi-pixel infrared detector, such as a focal plane array) for capturing infrared image data (e.g., still image data and/or video data) representative of an image, such as scene 180. In one example implementation, the infrared sensors of image capture component 150 provide for representing (e.g., converting) the captured image data as digital data (e.g., via an analog-to-digital converter included as part of the infrared sensor or separate from the infrared sensor as part of system 100).

In accordance with an embodiment, the infrared image data (e.g., infrared video data) may comprise non-uniform data (e.g., real image data) of an image, such as scene 180. Processing component 110 may be adapted to process the infrared image data (e.g., to provide processed image data), store the infrared image data in memory component 120, and/or retrieve stored infrared image data from memory component 120. For example, processing component 110 may be adapted to process infrared image data stored in memory component 120 to provide processed image data and information (e.g., captured and/or processed infrared image data).

Control component 130 comprises, in accordance with an embodiment, a user input and/or interface device that is adapted to generate a user input control signal. For example, the user input and/or interface device may include a rotatable knob (e.g., a potentiometer), push buttons, a slide bar, a keyboard, and the like. Processing component 110 may be adapted to sense control input signals from a user via control component 130 and respond to any sensed control input signals received therefrom. Processing component 110 may be adapted to interpret such a control input signal as a parameter value, as generally understood by one skilled in the art.

In accordance with an embodiment, control component 130 may comprise a control unit (e.g., a wired or wireless handheld control unit) having push buttons adapted to interface with a user and receive user input control values. In one implementation, the push buttons of the control unit may be used to control various functions of the system 100, such as autofocus, menu enable and selection, field of view, brightness, contrast, noise filtering, high pass filtering, low pass filtering, and/or various other features as understood by one skilled in the art.

Power component 140, in accordance with an embodiment, provides various power supply voltages (e.g., reference voltages, bias voltages, reference currents, or other desired bias and power signals) required by the IR camera architecture and optionally for the entire system 100, depending upon the specific application and requirements.

Display component 170 comprises, in accordance with an embodiment, an image display device (e.g., a liquid crystal display (LCD) or various other types of generally known video displays or monitors). Processing component 110 may be adapted to display image data and information on display component 170. Processing component 110 may be adapted to retrieve image data and information from memory component 120 and display any retrieved image data and information on display component 170. Display component 170 may comprise display electronics, which may be utilized by processing component 110 to display image data and information (e.g., infrared images). Display component 170 may be adapted to receive image data and information directly from image capture component 150 via the processing component 110, or the image data and information may be transferred from memory component 120 (e.g., via processing component 110).

Optional sensing component 160 comprises, in accordance with an embodiment, one or more sensors of various types, depending on the application or implementation requirements, as would be understood by one skilled in the art. The sensors of optional sensing component 160 provide data and/or information to at least processing component 110. In one aspect, processing component 110 may be adapted to communicate with sensing component 160 (e.g., by receiving sensor information from sensing component 160) and with image capture component 150 (e.g., by receiving data and information from image capture component 150 and providing and/or receiving command, control, and/or other information to and/or from one or more other components of system 100).

In various implementations, sensing component 160 may provide information regarding environmental conditions, such as outside temperature, lighting conditions (e.g., day, night, dusk, and/or dawn), humidity level, specific weather conditions (e.g., sun, rain, and/or snow), distance (e.g., via a laser rangefinder), and/or whether a tunnel or other type of enclosure has been entered or exited. Sensing component 160 may represent conventional sensors as generally known by one skilled in the art for monitoring various conditions (e.g., environmental conditions) that may have an effect (e.g., on the image appearance) on the data provided by image capture component 150.

In some implementations, optional sensing component 160 (e.g., one or more of sensors) may comprise devices that relay information to processing component 110 via wired and/or wireless communication. For example, optional sensing component 160 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques.

In accordance with one or more embodiments, components of system 100 may be combined and/or implemented or not, as desired or depending on the application or requirements, with system 100 representing various functional blocks of a related system. In one example, processing component 110 may be combined with memory component 120, image capture component 150, display component 170, and/or optional sensing component 160. In another example, processing component 110 may be combined with image capture component 150 with only certain functions of processing component 110 performed by circuitry (e.g., a processor, a microprocessor, a logic device, a microcontroller, etc.) within image capture component 150. Furthermore, various components of system 100 may be remote from each other (e.g., image capture component 150 may comprise a remote sensor with processing component 110, etc., representing a computer that may or may not be in communication with image capture component 150).

Figure 2A:
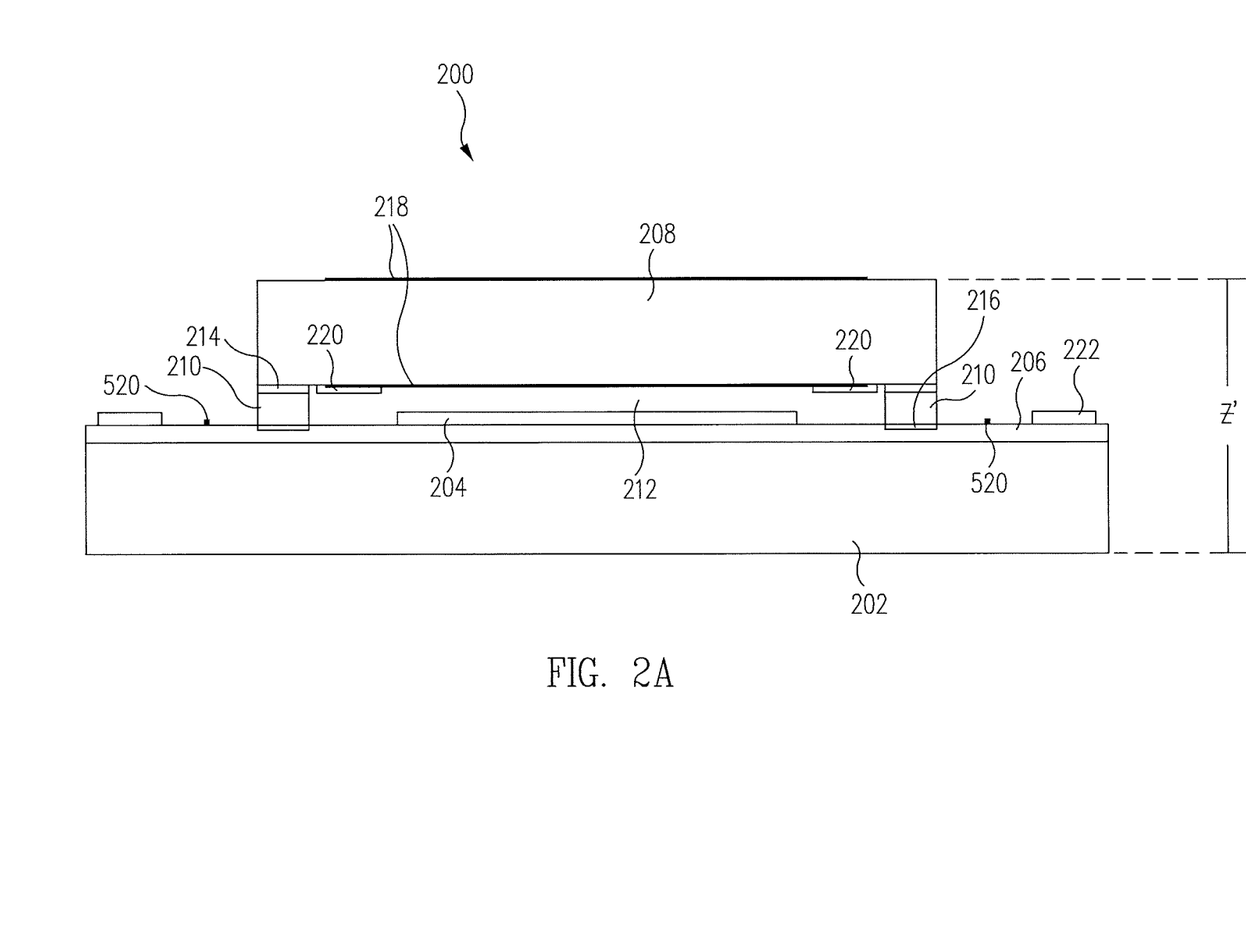
FIGS. 2A and 2B show cross-sectional side elevation views of illustrative infrared detectors in accordance with an embodiment.
Figure 2B:
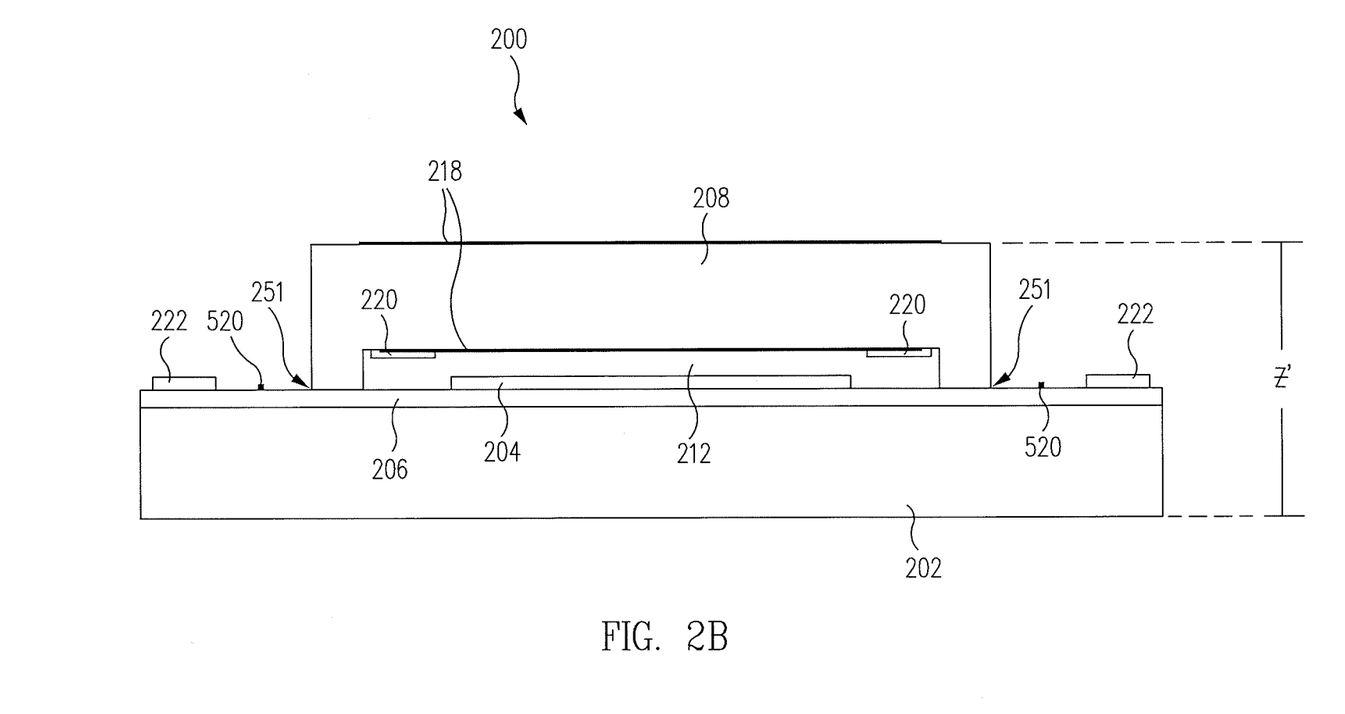

In some embodiments, image capture component 150 may comprise a vacuum package assembly (VPA), such as a wafer level package (WLP) VPA. FIGS. 2A and 2B are cross-sectional side elevation views of example embodiments of such an infrared detector produced in accordance with one or more embodiments of wafer level packaging (WLP) methods as discussed herein.

As illustrated in FIGS. 2A and 2B, infrared detector 200 includes a substrate 202 having an array 204 of infrared detector elements (e.g., microbolometers) and a readout integrated circuit 206 interconnected with the array 204 disposed on an upper surface thereof. As an example implementation, the array 204 may be referred to herein as a microbolometer array for a specific type of infrared detector, but it should be understood that the WLP techniques disclosed herein may be applied more generally to various types of circuit assemblies including, but not limited to various types of infrared detectors, as would be understood by one skilled in the art.

A lid or cap such as window 208 may be spaced above the array 204, the window 208 being substantially transparent to infrared light. A closed cavity 212 may be formed between the window 208 and the array 204 that encloses the infrared detector array 204. Cavity 212 may be formed from any suitable combination of a recess in window 208 and/or intervening structures such as mesas 210 formed between the window and substrate 202. FIG. 2A shows an example embodiment in which mesas between window 208 and substrate 202 form sidewalls of cavity 212. FIG. 2B shows an example embodiment in which window 208 is bonded to substrate 202 and cavity 212 is formed form a recess in window 208. However, it should be appreciated by one skilled in the art that cavity 212 may be formed from any suitable combination of a recess in window 208 and/or intervening structures such as mesas 210 formed between the window and substrate 202.

Referring now to FIG. 2A, a mesa 210 is coupled (e.g., bonded) to the window 208, for example, with a thermal oxide layer 214 such that the window 208 and the mesa 210 may form a bonded silicon on insulator (SOI) wafer pair for one or more embodiments. The mesa 210 has closed marginal side walls disposed between an outer periphery of a lower surface of the window 208 and an outer periphery of the upper surface of the substrate 202 and defines a closed cavity 212 between the window 208 and the array 204 that encloses the infrared detector array 204. A solder seal ring 216 is shown bonding the mesa 210 to the substrate 202 so as to seal the cavity 212 (e.g., to provide a hermetic seal for an evacuated WLP VPA).

In one example embodiment, the window 208 may comprise low-oxygen ($O_2$) silicon (Si) (or alternatively float zone silicon) having a thickness of less than about 625 microns (μm). In another example embodiment, the side walls of the mesa 210 may comprise Si having a width of about 550 μm and a height of less than about 100 μm. In another example embodiment, the mesa 210 and the window 208 may comprise a semiconductor, e.g., low-$O_2$ Si, and the upper surface of the side walls of the mesa 210 may be bonded to the lower surface of the window 208 by a layer of a thermal oxide 214 of the same semiconductor, e.g., silicon dioxide ($SiO_2$), having a thickness of about 1 μm. In yet another embodiment, the lower surface of the side walls of the mesa 210 may be bonded to an upper surface of the substrate 202 by a joint of fused or layered solder rings 216 of, e.g., an alloy of titanium (Ti)/nickel (Ni)/gold-tin-gold ($AuSn_xAu$), respectively formed, e.g., using photolithography techniques, on the lower surface of the side walls of the mesa 210 and the upper surface of the substrate 202 and having a combined thickness of, e.g., about 4 μm and a width of, e.g., about 450 μm.

In one embodiment, as illustrated in FIG. 2B, cavity 212 may be formed from a recess in a monolithic window 208 that is bonded to substrate 202 by bonds 251. Bonds 251 may be formed by any suitable bonding materials and/or methods for bonding a window substrate to the substrate 202 so as to seal the cavity 212 (e.g., to provide a hermetic seal for an evacuated WLP VPA).

In one embodiment, the infrared detector 200 may include at least one antireflective coating 218, e.g., Zinc Sulfide (ZnS)/Germanium (Ge), formed, e.g., by a physical vapor deposition (PVD) method, on an upper and/or a lower surface of the window 208 to prevent infrared light incident upon the coated surfaces from being reflected away from the microbolometer array 204. In another embodiment, a getter 220, e.g., Zirconium (Zr) alloy, may be formed, e.g., by sputtering, on a lower surface of the window 208 in the cavity 212 before, during, and/or after it has been evacuated. The getter material process may be provided, for example, by SAES Getters™ of Colorado Springs, Colo. It should be understood that the materials, dimensions, and processes disclosed herein are examples for one or more embodiments and are not limiting and that other suitable materials and processes, as would be understood by one skilled in the art, may be used in accordance with one or more embodiments.

As illustrated in FIGS. 2A and 2B, infrared detector 200 may include at least one electrical test pad 222 disposed on the upper surface of the substrate 202 adjacent to the outer periphery of the window 208. As discussed in more detail below, the test pad 222 may be coupled to the readout integrated circuit 206 and used to test the infrared detector 200 electrically at the wafer level and before it is singulated.

Infrared detector 200 may be a thinned infrared detector having a total thickness Z'. Thickness Z' of a thinned infrared detector may be reduced with respect to conventional infrared detector vacuum package assemblies due to thinning of one or both of substrate 202 and/or window 208 during wafer level packaging and processing operations. As examples, Z' may be less than 400 microns, less than 300 microns, less than 200 microns, between 200 microns and 500 microns, between 100 microns and 500 microns, between 100 microns and 300 microns, or any other suitable reduced thickness that provides a mechanical strength for the window that is sufficient to prevent fracture or permanent deformation of the window material.

Figure 3:
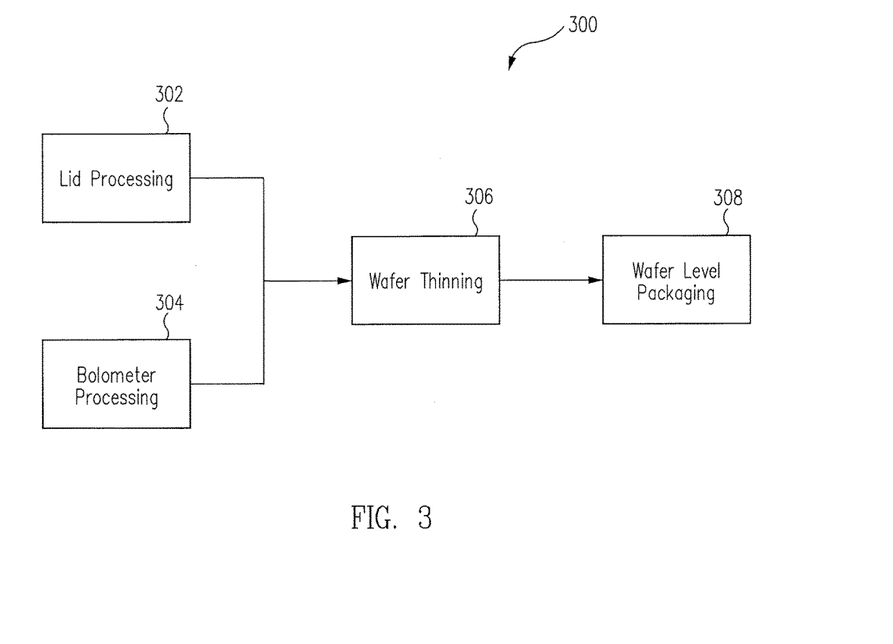
FIG. 3 is process flow diagram of an illustrative wafer level processing (WLP) method for producing an infrared detector in accordance with an embodiment.

Following is a description of an example embodiment of a method 300 (FIG. 3) by which the example infrared detector 200 of FIGS. 2A and/or 2B, as well as other infrared detectors or circuit packages, may be manufactured reliably and efficiently in volume quantities using wafer level packaging (WLP) techniques. As illustrated in the top level overview of the method in FIG. 3, in one embodiment, the example method 300 may begin at block 302 with the provision of a first wafer such as a lid wafer (sometimes referred to herein as a "cap" wafer or a "window" wafer) and at block 304 with the provision of a second wafer such as a "bolometer" wafer (sometimes referred to herein as a BOLO wafer or a detector wafer). Various processing operations such as, for example, those described hereinafter may be performed to form the lid wafer and the bolometer wafer. The first and second wafer may be attached together to form a wafer assembly. Method 300 may then proceed at block 306 with wafer thinning processes in which one or both of the first and second wafer are thinned (e.g., by grinding and/or polishing one or both of the wafers). Method 300 may then proceed at block 308 with the WLP processes that process the assembly (e.g., at least in part by aligning dicing equipment with the assembly by viewing alignment marks through at least a portion of the first wafer, slicing through the first wafer along dicing lanes of the wafer assembly based on the aligning, performing wafer level electrical tests using test pads on the second wafer that have been exposed by the slicing, and slicing through the second wafer along the dicing lanes to singulate the circuit packages) to generate a plurality of circuit packages such as infrared detectors such as infrared detector 200. The WLP processes at block 308 may include aligning the dicing equipment by viewing the alignment marks through a portion of a thinned wafer such as a thinned lid wafer of an infrared detector wafer assembly having a detector wafer attached to the thinned lid wafer. The alignment marks may be formed at one or more locations on and/or within the first and/or second wafers such that, following optional wafer thinning operations at block 306, the alignment marks are viewable through some or all of the first wafer (e.g., the lid wafer). Method 300 may also include device or system assembly processes such as device integration processes to integrate one or more of infrared detectors such infrared detector 200 into a camera module and/or other electronic device.

Figure 4:
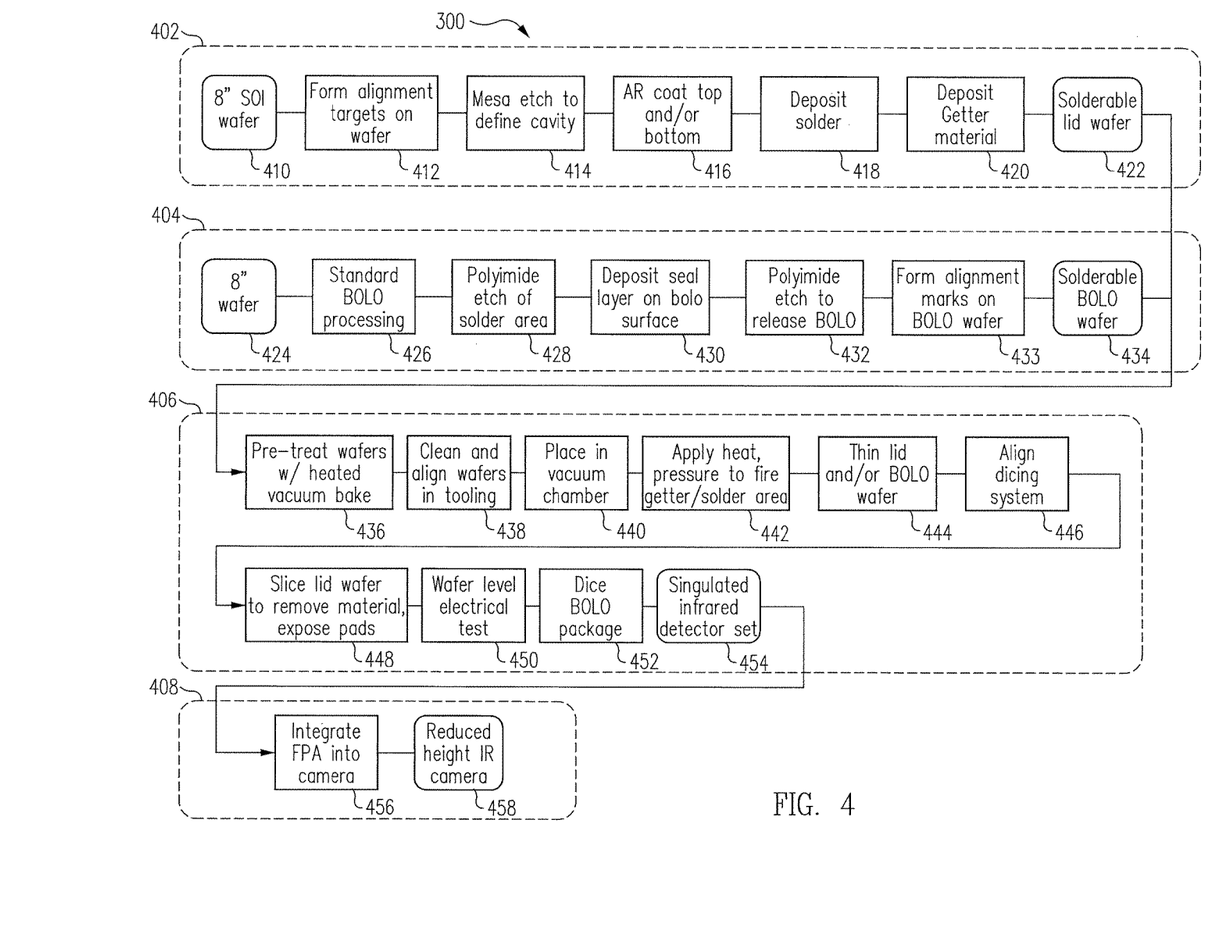
FIG. 4 is a more detailed process flow diagram of the method of FIG. 3 in accordance with an embodiment.
Figure 5A:
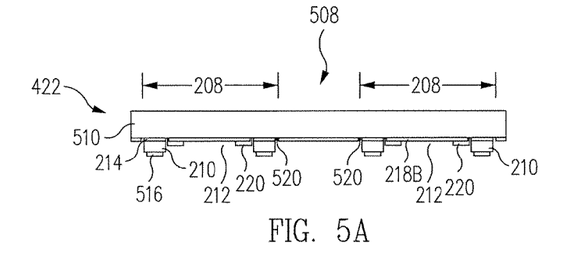
FIGS. 5A-5G are partial side elevation views of illustrative wafer-level packaging components at various stages during WLP production of an example embodiment of a microbolometer VPA in accordance with one or more embodiments.
Figure 5B:
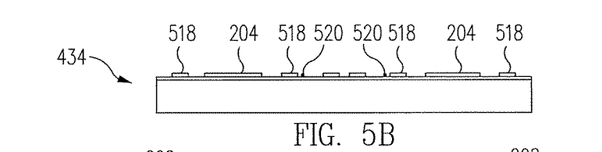

As illustrated in detail in FIG. 4, the example WLP method 300 may comprise a "lid wafer" production method 402 for forming a lid wafer and a "bolometer wafer" production method 404 for forming a detector wafer, that merge into a "wafer assembly and bonding" method 406, followed optionally by a "system integration" method 408. The various stages set forth in FIG. 4 are described in detail as follows for one or more embodiments. FIGS. 5A and 5B will also be described in connection, respectively, with "lid wafer" production method 402 and "bolometer wafer" production method 404 of FIG. 4. FIGS. 5C-5G and FIG. 6 will also be described in connection with "wafer assembly and bonding" method 406 of FIG. 4.

As illustrated in FIG. 4, the example lid wafer production method 402 for forming a lid or window wafer begins with the provision of a wafer 410 (e.g., a silicon-on-insulator (SOI) wafer such as an 8" SOI wafer). Wafer 410 may, in some embodiments, have a layer of oxide, (e.g., a thermal oxide layer), sandwiched between two additional layers such as a "window" layer and a "mesa" layer, each formed of a semiconductor material, (e.g., Si).

At block 412, an array of "targets" (e.g., alignment targets used to define resulting windows for corresponding infrared detectors 200 and/or alignment targets that may be useful for the formation of corresponding mesas 210, associated cavities 212, and/or dicing the lid wafer and/or the bolometer wafer such as alignment marks 520) may be formed (e.g., using photolithography techniques) on a surface of the wafer 410 (e.g., on the window layer or the mesa layer of the wafer 410) and/or within the wafer 410. Alignment targets may be formed (e.g., etched) on a surface such as an inner surface of wafer 410 that is to face a corresponding surface of a bolometer wafer when the wafers are attached so that the alignment targets may be viewed (e.g., by an infrared camera) through the wafer (e.g., through an opposing surface of the wafer after the wafer has been thinned). In some embodiments, alignment targets may also be formed on an outer surface of wafer 410 to be used for alignment purposes for processes performed prior to a thinning of the lid wafer that removes the alignment targets on the outer surface. In some embodiments, alignment targets may be formed within wafer 410 so that the alignment targets may be viewed (e.g., by an infrared camera) through a portion of the wafer.

At block 414, cavities may be defined in wafer 410 to define an array of detector lids (e.g., windows 208) in the wafer 410 that are substantially transparent to infrared light. In one exemplary embodiment, at block 414, an array of mesas 210 and cavities 212 on may be etched on wafer 410 (e.g., using a Deep Reactive Ion Etching (DRIE) process or other suitable etching process). The array of mesas 210 and cavities 212 on may be etched in the surface of the mesa layer of the window wafer 410. The etching defines an array of detector lids (e.g., windows 208) in the window layer of the wafer 410 that are substantially transparent to infrared light, each of which is surrounded by a mesa 210 having closed marginal side walls bonded to the window layer by the oxide layer 214 as shown in FIG. 5A.

Using a single semiconductor and etch process may suffice to form a mesa and windows, however, in some embodiments, a two part lid wafer may be used which is separated by a separation or bonding layer (e.g. oxide layer 214). In such an embodiment, the etching process at block 414 may include etching the surface of the lid wafer 410 down to the oxide layer using, for example, a DRIE process, so as to form the array of mesas 210 and associated cavities 212. The oxide layer, which may act as a etch stop, may be selectively removed from the surface of the lid wafer 410 in such a way that the lower surfaces of the windows 208, which correspond to lower surface of the window layer of the lid wafer 410, retain their as-formed window-layer smoothness and planarity, while the respective marginal side walls of the mesas 210 remain firmly bonded to the lid wafer 410 by the remaining oxide layer. This latter removal process may be effected, for example, using a hydrofluoric acid etching technique to remove the oxide layer 214 in the region of cavities 212. In various embodiments, the separation layer may be a variety of other boding materials.

At block 416, antireflective coatings and/or other coatings may optionally be formed on one or both of the upper and lower surfaces of the windows 208 in wafer 410. In embodiments in which the lid wafer is to be thinned, at block 416, an anti-reflective coating 218B (see FIG. 5A) may be formed only on the lower (inner) surface of window layer 510 of the wafer.

At block 418, a sealing ring such a sealing ring 516 (see FIG. 5A), which may comprise liftoff seal layers of an adhesion layer (e.g., titanium (Ti)), a barrier material (e.g., nickel), and a solder layer comprising, e.g., gold (Au) and tin (Sn) may be deposited on the window wafer 410.

At block 420, a getter material such as getter material 220 may be selectively deposited on the lower surface of each of the windows 208 of wafer 410 to generate a solderable lid wafer 422 that is ready for assembly with a corresponding bolometer wafer, as discussed in more detail below.

As discussed above in connection with FIG. 3, the example WLP method 300 may comprise a "bolometer wafer" production method 404. FIGS. 4 and 5B illustrate some more of the details of the bolometer wafer production method 404, which begins with the provision of a wafer, (e.g., a Si wafer such as an 8" silicon wafer).

At block 426, conventional processing to produce arrays of infrared detector elements (e.g., microbolometers) 204 on a surface of wafer 424 to form a bolometer wafer may be performed.

At block 428, in one embodiment, a layer of a polymer such as polyimide on the bolometer wafer may be etched using, e.g., photolithography techniques, to form a trench in the polymer layer around each of the microbolometer arrays 204 of the wafer 424.

At block 430, a sealing ring material may then be deposited (e.g., using conventional liftoff photolithography techniques) in the trenches of the polymer layer to form sealing rings 518 therein.

At block 432, following the deposition of the sealing ring material 518, the polymer layer may be removed from the wafer 424.

Figure 6:
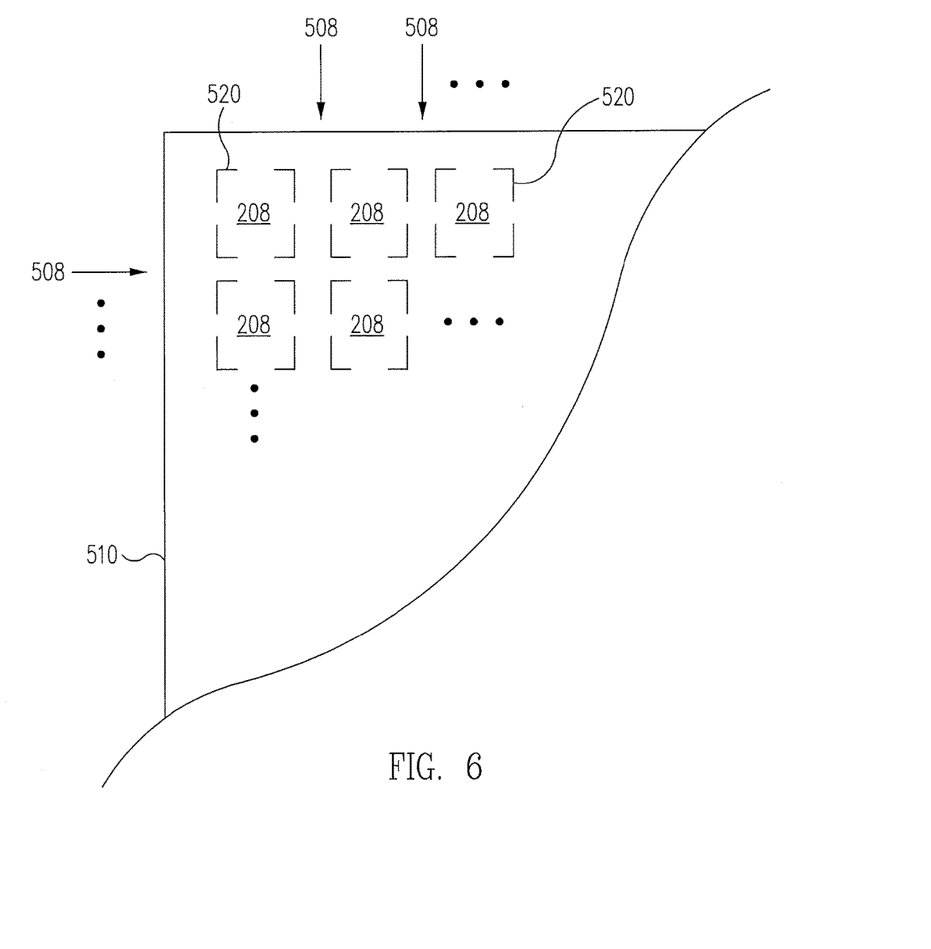
FIG. 6 is a top view of a portion of an illustrative detector wafer and lid wafer assembly showing how alignment marks can be viewed through the lid wafer using an infrared camera during dicing operations, in accordance with an embodiment.

At block 433, one or more alignment marks such as alignment marks 520 of FIG. 5B (side view) and FIG. 6 (top view) may be formed on the bolometer wafer 424 (e.g., by etching, printing, depositing, patterning, or other suitable wafer level processes). Alignment marks 520 may be formed at any suitable location on wafer 424 for later alignment of dicing equipment with dicing lanes 508. However, this is merely illustrative. In some embodiments, alignment marks 520 may be formed on an inner surface of lid wafer 422 (e.g., at block 412) in addition to or instead of forming alignment marks 520 on wafer 424.

As shown in FIG. 6, in one suitable embodiment, alignment marks 520 may include a plurality of L-shaped alignment marks that indicate the boundaries of each window 208 to be formed from window layer 510 of lid wafer 422. However, this is merely illustrative. In various embodiments, alignment marks 520 may be formed having any suitable shape, location, and/or arrangement such that alignment equipment may view the alignment marks 520 through lid wafer 422 to align dicing equipment with dicing lanes 508. Following formation of the alignment marks 520, the method 404 may conclude resulting in a solderable bolometer wafer 434 that is ready for assembly with a corresponding lid wafer 422, as discussed in more detail below.

Wafer-assembly-and bonding method 406 may begin at block 436 at which the bolometer wafer 434 and/or the lid wafer 422 may be pretreated with a heated vacuum bake, as would be understood by one skilled in the art.

Figure 5C:
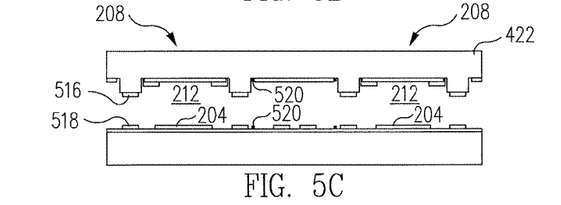

At block 438, wafers 422 and 434 may be cleaned and aligned with each other as shown in FIG. 5C. Wafers 422 and 434 may be cleaned and aligned with each other in, for example, a fixture or tool (e.g., either within or outside of a vacuum chamber) designed to hold the wafers in alignment such that the lid wafer 422 is positioned above the bolometer wafer 434, the cavities 212 of the lid wafer 422 are respectively disposed over corresponding ones of the microbolometer arrays 204 on the bolometer wafer 434, and the respective solder seal rings 516 and 518 on the mesas 210 and the bolometer wafer 434 are precisely aligned with each other. In some embodiments wafers 422 and 434 may be spaced apart from each other using one or more optional shims.

At block 440, wafers 422 and 434 may be placed into a vacuum chamber.

Figure 5D:
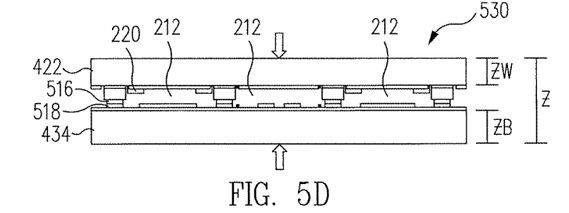

As shown in FIG. 5D, at block 442 of the method 406 of FIG. 4, wafers 422 and 434 may be pressed together and heated (e.g., in a vacuum chamber) to a temperature sufficient to attach the two wafers together by, for example, joining the respective solder sealing rings 516 and 518 on the two wafers together to form sealing ring 216, thereby sealing the evacuated cavities 212 enclosing respective ones of the microbolometer arrays 204 against exposure to any undesirable atmospheric gasses. Additionally, in some embodiments, the application of heat to the wafer assembly 530 may be used to "fire," i.e., activate, the getters 220 in the cavities 212 such that they function to adsorb any air molecules or other undesired gasses that might remain in the cavities 212 before, during, and/or after they are vacuum sealed. The getters 220 may also be activated by application of a current or other type of trigger to activate, as would be understood by one skilled in the art.

As shown in FIG. 5D, lid wafer 422 may have a thickness ZW and bolometer wafer 434 may have a thickness ZB. For example, in one illustrative embodiment, thickness ZW may be between 400 microns and 725 microns. For example, in one illustrative embodiment, thickness ZB may be between 400 microns and 725 microns.

Figure 5E:
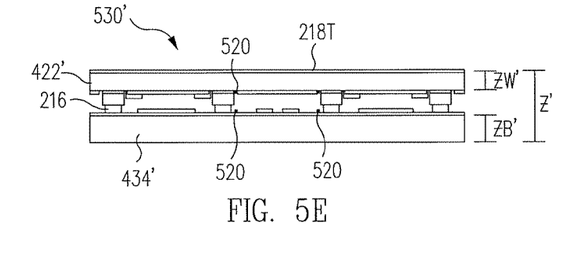

In order to provide relatively thinner infrared detector packages (e.g., for assembly and/or integration into portable or other compact electronic devices or systems), at block 444, one or more of lid wafer 422 and/or bolometer wafer 434 may be thinned (e.g., by grinding one or both outer surfaces of assembly 530) and, if desired, polishing the grinded surface(s) (e.g., using a chemical-mechanical planarization (CMP) or double-side polishing (DSP) process). Thinning lid wafer 422 may include thinning lid wafer 422 to form a thinned lid wafer 422' having a reduced thickness ZW' as shown in FIG. 5E. For example, in one embodiment, ZW' may be between 50 μm and 400 μm. Thinning bolometer wafer 434 may include bolometer wafer 434 to form a thinned bolometer wafer 434' having a reduced thickness ZB'. For example, in one embodiment, ZB' may be between 50 μm and 400 μm. In this way, the overall thickness of wafer assembly 530 may be reduced from a thickness Z to a reduced thickness Z' to form a thinned wafer assembly 530'.

At block 446 of method 406 of FIG. 4, a dicing system such as a system having dicing equipment (e.g., a dicing saw) and alignment equipment such as one or more actuators and one or more infrared cameras may be aligned with thinned wafer assembly 530'. Aligning the dicing system with thinned wafer assembly 530' may include capturing images such as infrared images (e.g., short wavelength infrared (SWIR) images) of alignment marks 520 through at least a portion of thinned lid wafer 422' and aligning a dicing saw with one or more of dicing lanes 508 (e.g., automatically or manually) that separate adjacent rows and columns of windows in the lid wafer and adjacent rows and columns of detector element arrays in the bolometer wafer using the captured images of the alignment marks.

Various image processing operations may be performed for identifying alignment marks in captured images and determining the physical location of the identified alignment marks with respect to dicing equipment.

Figure 5F:
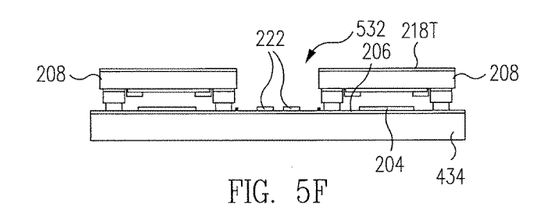

As illustrated in FIG. 5F, at block 448, thinned lid wafer 422' may be sliced through along dicing lanes 508 of thinned wafer assembly 530' using the dicing system (e.g., while actively aligning the dicing saw using the infrared camera and the alignment marks during dicing operations) so as to create openings such as opening 532 of FIG. 5F that expose the underlying test pads 222 on the upper surface of the bolometer wafer (e.g., a thinned bolometer wafer 434' or a non-thinned bolometer wafer). At block 448, additional WLP operations may also be performed such as annealing operations (e.g., bond pad annealing).

At block 450, a wafer level electrical test of some or all of the infrared detectors 200 to be singulated from thinned wafer assembly 530' may be performed using, for example, a probe card or other electrical test equipment by coupling the electrical test equipment to contacts 222 of thinned wafer assembly 530', before singulating the wafer assembly.

Figure 5G:
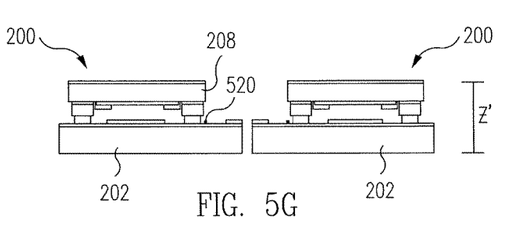

At block 452, after any wafer level electrical testing of the thinned wafer assembly 530' has been concluded, thinned wafer assembly 530' may be diced to form individual infrared detectors 200 from the wafer assembly, e.g., by slicing through the bolometer wafer along the dicing lanes of the wafer assembly (e.g., between test pads 222 of adjacent infrared detectors 200), thereby generating a set 454 of completed infrared detectors 200 as shown in FIG. 5G.

System integration method 408 may begin at block 456 at which one or more of the singulated infrared detectors 200 (e.g., one or more FPA's) may be integrated with other system components or device components of a camera (e.g., lenses, processors, memory, displays, or other camera components), or other devices such as reduced-height camera 458 of FIG. 4 or system 100 of FIG. 1 (as examples).

Although the processes described above in connection with FIGS. 4 and 5A-5G have been described with respect to aligning and dicing of a thinned wafer assembly, the methods described herein may be used for aligning and dicing any suitable wafer assembly in which alignment marks on the first wafer of the assembly are viewed through a second wafer assembly (e.g., using infrared light such as SWIR light). As examples, alignment marks on a detector wafer such as a non-thinned bolometer wafer may be viewed through a thinned lid wafer, a non-thinned lid wafer or another wafer attached to the detector wafer. In other examples, alignment marks on a detector wafer such as a thinned bolometer wafer may be viewed through a thinned window wafer, a non-thinned window wafer or another wafer attached to the thinned detector wafer.

Figure 7:
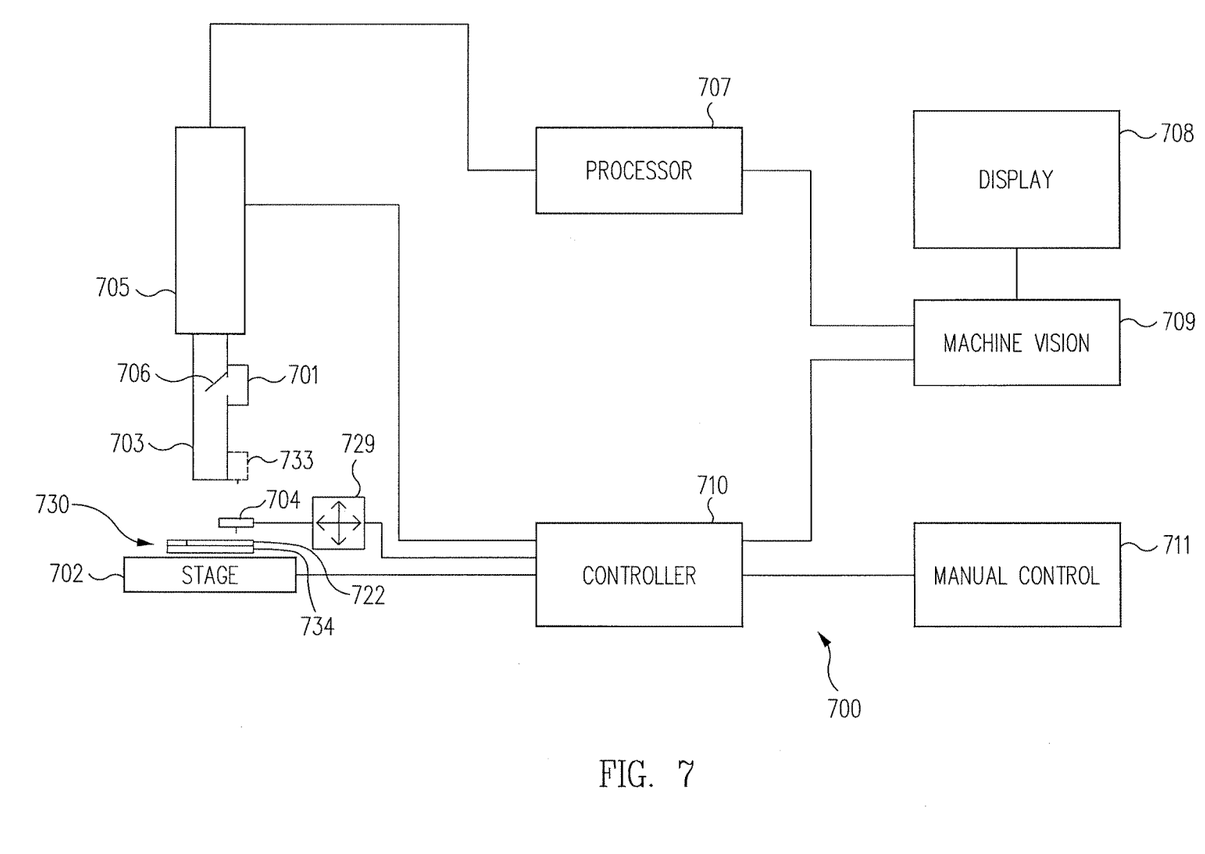
FIG. 7 is a block diagram of an illustrative alignment and dicing system having an infrared camera, in accordance with an embodiment.

Referring now to FIG. 7 in accordance with one or more embodiments, an alignment and dicing system 700 is disclosed. As shown in FIG. 7, system 700 may include an infrared camera 705. Infrared camera 705 may be a short wavelength infrared (SWIR) camera, a visible light camera having an extended infrared sensitivity, a combination of these or one or more other camera components capable of capturing images in response to light that passes through some or all of a substrate of a wafer assembly such as wafer assembly 730 (e.g., a thinned wafer assembly such as thinned wafer assembly 530' of FIG. 5E, a non-thinned wafer assembly such as wafer assembly 530 of FIG. 5D, or other wafer assemblies). For example, camera 705 may view alignment marks formed on and/or within a detector wafer such as detector wafer 734 (e.g., thinned bolometer wafer 434' or bolometer wafer 434) and/or formed on an interior surface of or within a lid wafer such as lid wafer 722 through a portion of lid wafer 722 that is attached to the detector wafer (e.g., thinned window wafer 422' or window wafer 422).

Camera 705 may capture images such as infrared images of alignment marks such as alignment marks 520 as viewed through a portion of a lid wafer attached to the detector wafer. Images captured by infrared camera 705 may be provided to a processor such as processor 707 and/or a machine vision system 709. Processor 707 and/or machine vision system 709 may, for example, identify alignment marks 520 in the captured images from camera 705 and control equipment such as controller 710 may operate dicing equipment such as dicing saw 704 to saw through thinned lid wafer 422' along dicing lanes 5'08 to expose contacts 222 on detector wafer 434' (or detector wafer 434) as described above in connection with, for example, FIG. 5F.

System 700 may include actuating equipment such as actuator 729 for moving dicing saw 704 based on the location of alignment marks such as alignment marks 520 as determined using the captured images from camera 705. In this type of configuration, dicing equipment 704 may move with respect to wafer assembly 730 while camera 705 remains stationary with respect to wafer assembly 730. However, this is merely illustrative. In some embodiments, dicing equipment for cutting window wafer 722 such as dicing equipment 733 may be attached to camera 705 and may be moved along with camera 705 with respect to wafer assembly 730.

System 700 may, in some embodiments, include a light source such as light source 701 (e.g., an infrared light source, a visible light source, or other light source) that can be operated by controller 710 to provide light such as infrared light for the system. Light source 701 may be integrated with optics such as optics 703 (e.g., a microscope) of camera 705 to provide desired wavelengths of infrared light onto wafer assembly 730 through optics 703. In this way, alignment marks may be illuminated using infrared light even though a detector wafer 734 may be formed from a material that is opaque to infrared light such as an epitaxial material.

Light source 701 may inject light into the optical path of camera 705. For example, light source 701 may provide light having the desired wavelengths for illuminating alignment marks through lid wafer 722 along an optical path of optics 703 of camera 705, such as with the use of one or more optical components 706 (e.g., a beam splitting mirror, a prism and/or a lens). Optical component 706 may be incorporated as part of optics 703 and/or light source 501, as would be understood by one skilled in the art. Thus, light may be provided through optics 703 (e.g., a microscope) to provide illumination of wafer assembly 730 during the alignment operation of dicing equipment with wafer assembly 730 without reflections of the provided light due to off-angle illumination. Light source 701 may provide infrared light to the detector wafer through the window wafer.

Wafer assembly 730 may be mounted upon a stage such as stage 702. In some embodiments stage 702 may be a two or three dimensional positioning stage that is configured to effect movement of wafer assembly 730 with respect to stationary dicing equipment. Stage 702 and/or dicing equipment 704 or 733 may be controllable to the necessary precision so as to effect alignment of the dicing equipment with the wafer package to within a predetermined tolerance. For example, if alignment within a tolerance of 0.003 inch is required, stage 702 and/or dicing equipment 704 or 733 may be positionable within a tolerance of 0.001 inch.

Optics 703 may include a microscope that facilitates viewing of alignment marks on detector wafer 734 or an interior surface of lid wafer 722 through lid wafer 722 so as to facilitate alignment of dicing equipment with dicing lanes of wafer assembly 730. The microscope may facilitate imaging of alignment marks using infrared light such as SWIR light that passes through lid wafer 722.

The microscope may have any desired power. Thus, the microscope may have unitary power, positive power, and/or negative power. Different powers may be used for different portions of a dicing operation (e.g., for sawing through lid wafer 722 to expose electrical contacts for wafer-level electrical testing and for sawing through detector wafer 734 to singulate individual infrared detector packages or other circuit packages). Different powers may be used for different sizes or other characteristics of the alignment features.

Optics 703 may include any desired combination of polarization filters, wavelength filters, polarization rotators, or any other optical elements that may be used to optically process infrared energy and/or visible light from wafer assembly 730 prior to generating images in response to the infrared energy and/or visible light. As those skilled in the art will appreciate, such optical processing may enhance an image to better facilitate alignment of dicing equipment with dicing lanes of wafer assembly 730.

Infrared camera 705 may include any type of infrared detector, depending upon the desired application and specific requirements, as would be understood by one skilled in the art. For example, infrared camera 705 may include an indium gallium arsenide (InGaAs) infrared detector adapted to detect wavelengths in a range of approximately 0.85 to approximately 1.7 micrometers. Alternatively or in addition, infrared camera 705 may include an indium antimonide (InSb) infrared detector and/or a mercury cadmium telluride (HgCdTe) infrared detector.

A processor such as processor 707 may receive signals representative of infrared images from infrared camera 705. Processor 707 may electronically process the images so as to make the images more useful in the alignment process. For example, processor 707 may electronically filter the images, electronically magnify the images, change colors of the images, add artificial color to the images, superimpose or otherwise blend or fuse visible light and infrared images, integrate a plurality of images, or otherwise enhance the images.

Processor 707 may provide signals representative of the processed images to machine vision equipment 709 and/or display 708. Display 708 may facilitate human viewing of the images. In this manner, a human operator may manually move stage 702 and/or dicing equipment 704 and/or 733 so as to effect desired alignment of the dicing equipment with respect wafer assembly 730.

Processor 707 may provide signals representative of the processed images to machine vision system 709. Machine vision system 709 may facilitate automated control of the alignment and/or dicing process. In this manner, a computer or processor of the machine vision system 709 may automatically move stage 702, and/or dicing equipment 704 or 733 so as to effect desired alignment of the dicing equipment with dicing lanes of wafer assembly 730. Any desired combination of manual and automated control may be used.

Controller 710 may receive control signals, such as from machine vision system 709, processor 707, and/or manual control 711. Controller 710 may provide drive signals to actuator 729, dicing equipment 704, dicing equipment 733, and/or stage 702 to facilitate desired movement of the dicing equipment with respect to wafer assembly 730 based on images of alignment marks as viewed through lid wafer 722 using camera 705.

Systems and methods are disclosed herein to provide, for example, thinned circuit packages such as thinned infrared camera architectures and/or thinned infrared detectors in accordance with one or more embodiments. For example, in accordance with an embodiment of the invention, an infrared camera architecture is disclosed that integrates the entire IR camera electronics, thermal management, and optical alignment functionality into a single component (e.g., a single package or chip core). The infrared camera architecture, for example, may represent an easy to design-in electronic component for device and system applications. Techniques are also disclosed to manufacture the infrared detector based on WLP techniques using infrared imaging in accordance with one or more embodiments.

The infrared camera architectures disclosed herein may provide certain advantages over conventional infrared camera architectures. For example, the techniques disclosed herein for one or more embodiments of the invention may provide for greater miniaturization of the infrared camera and at reduced manufacturing costs and allow for higher volume production. The thinned infrared camera architectures may help reduce the thickness of electronic devices such as handheld electronic device such as cameras and/or mobile phones. The infrared camera architectures further may reduce, simplify, or eliminate complex calibration procedures, thermal management, and optical alignment requirements and thus, provide a thinned infrared camera that may be easily incorporated into and supported for a desired application.

Various specific examples of components and arrangements associated with infrared detectors are described herein. However, these are, of course, merely examples and are not intended to be limiting. In general, the processes described herein may be used to perform wafer level processing operations for any semiconductor devices having multiple substrates in which alignment marks are viewed through at least a portion of one of the substrates during wafer processing operations.

While the invention has been described in detail in connection with only a limited number of embodiments of the invention, it should be readily understood that the invention is not limited to such disclosed embodiments. Rather, the invention may be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims and functional equivalents thereof.

What is claimed is:

1. A method, comprising:
    thinning a first wafer that is attached to a second wafer, wherein the first wafer comprises a lid wafer of an infrared detector wafer assembly and wherein the second wafer comprises a detector wafer of the infrared detector wafer assembly, and wherein alignment marks are provided on and/or within the first wafer and/or on and/or within the second wafer prior to the thinning;
    capturing, by a short wavelength infrared camera viewing through at least a portion of the thinned first wafer, a short wavelength infrared image of the alignment marks;
    aligning a dicing equipment with dicing lanes of the thinned first wafer based on the short wavelength infrared image of the alignment marks, wherein the dicing lanes are between at least two of the alignment marks; and
    slicing through the thinned first wafer, based on the aligning by the dicing equipment using the at least two of the alignment marks, along the dicing lanes to expose test pads provided on the second wafer.

2. The method of claim 1, further comprising providing a wafer assembly having the first wafer attached to the second wafer, wherein the first wafer is transparent to short wavelength infrared light, and wherein a solder sealing ring of the first wafer is attached to a solder sealing ring of the second wafer.

3. The method of claim 1, wherein the lid wafer includes an array of cavities in an interior surface of the lid wafer, wherein adjacent rows and columns of the array are separated from each other by the dicing lanes, and wherein the detector wafer comprises:
an upper surface with an array of infrared detector arrays corresponding in size and location to a corresponding one of the cavities in the lid wafer; and
a corresponding array of readout integrated circuits respectively interconnected with associated ones of the infrared detector arrays disposed thereon, wherein adjacent rows and columns of the array of the infrared detector arrays are separated from each other by the dicing lanes.

4. The method of claim 3, further comprising creating an opening in the thinned first wafer above the test pads by the slicing and performing a wafer level electrical test of the infrared detector arrays using the test pads that are accessible by a test equipment via the opening.

5. The method of claim 4, further comprising slicing through the detector wafer along the dicing lanes after the wafer level electrical test.

6. The method of claim 5, further comprising assembling, into a camera, an infrared detector formed by the slicing through the detector wafer.

7. The method of claim 1, further comprising illuminating the alignment marks through the portion of the thinned first wafer, and wherein the thinned first wafer comprises a getter material.

8. The method of claim 7, wherein the illuminating comprises providing a short wavelength infrared light from a light source through an optical element of the short wavelength infrared camera, and wherein the short wavelength infrared camera is configured to detect wavelengths in a 0.85 to 1.7 µm range.

9. An infrared detector manufactured according to the method of claim 1, the infrared detector comprising:
a substrate formed from the second wafer and having an array of infrared detector elements and a readout integrated circuit interconnected with the array and disposed on an upper surface thereof;
a lid formed from the thinned first wafer and located above the array, the lid being substantially transparent to infrared light;
a closed cavity that encloses the array between the lid and the substrate; and
at least one alignment mark formed within the lid, on an interior surface of the lid, on the upper surface of the substrate, and/or within the substrate.

10. The infrared detector of claim 9, wherein the lid comprises a diced portion of a thinned semiconductor wafer.

11. The infrared detector of claim 10, further comprising an antireflective coating on the lid.

12. A camera comprising the infrared detector of claim 9.

13. An electronic device comprising the infrared detector of claim 9.

14. A system configured to perform the method of claim 1, the system comprising:
the short wavelength infrared camera configured to capture the short wavelength infrared image, by viewing through the lid wafer of the infrared detector wafer assembly, of the alignment marks;
the dicing equipment; and
a processing and control equipment configured to receive the short wavelength infrared image from the short wavelength infrared camera and to operate the dicing equipment to slice through the lid wafer along the dicing lanes based on the short wavelength infrared image.

15. The system of claim 14, the system further comprising a light source coupled to optics of the short wavelength infrared camera that illuminates the infrared detector wafer assembly through the optics of the short wavelength infrared camera.

16. The system of claim 15, wherein the optics comprise a microscope on the infrared camera.

17. The system of claim 16, wherein the processing and control equipment comprises a machine vision system.

18. The system of claim 17, wherein the machine vision system is configured to operate the dicing equipment to slice through the detector wafer of the infrared detector wafer assembly along the dicing lanes based on the short wavelength infrared image following a wafer level electrical test of the infrared detector wafer assembly using the test pads on the detector wafer exposed by the slice through the lid wafer.

* * * * *

UNITED STATES PATENT AND TRADEMARK OFFICE
CERTIFICATE OF CORRECTION

PATENT NO. : 10,153,204 B2
APPLICATION NO. : 14/728967
DATED : December 11, 2018
INVENTOR(S) : Tiahaar Kurtheru Clayton McKenzie et al.

Page 1 of 1

It is certified that error appears in the above-identified patent and that said Letters Patent is hereby corrected as shown below:

In the Specification

Column 13, Line 67, change "dicing lanes 5'08" to --dicing lanes 508--.

Signed and Sealed this
Nineteenth Day of March, 2019

Andrei Iancu
*Director of the United States Patent and Trademark Office*